United States Patent [19]
Lee et al.

[11] Patent Number: 5,812,475
[45] Date of Patent: Sep. 22, 1998

[54] PROGRAMMABLE REFRESH CIRCUITS AND METHODS FOR INTEGRATED CIRCUIT MEMORY DEVICES

[75] Inventors: Sang-Kil Lee, Kyungki-do; Hyun-Soon Jang, Seoul, both of Rep. of Korea

[73] Assignee: Samsung Electronics Co., Ltd., Kyungki-do, Rep. of Korea

[21] Appl. No.: 770,845

[22] Filed: Dec. 20, 1996

[30] Foreign Application Priority Data

Dec. 23, 1995 [KR] Rep. of Korea .................. 1995-55737

[51] Int. Cl.[6] ...................................................... G11C 7/00
[52] U.S. Cl. ........................................ 365/222; 365/225.7
[58] Field of Search ................................. 365/222, 225.7, 365/236

[56] References Cited

U.S. PATENT DOCUMENTS

| | | | |
|---|---|---|---|
| 5,243,576 | 9/1993 | Ishikawa | 365/222 |
| 5,287,319 | 2/1994 | Fukumoto | 365/222 |
| 5,446,695 | 8/1995 | Douse et al. | 365/225.7 |

*Primary Examiner*—Vu A. Le
*Attorney, Agent, or Firm*—Myers Bigel Sibley & Sajovec

[57] ABSTRACT

A self refresh circuit for an integrated circuit memory device includes a programmable refresh circuit, a plurality of counters, and a refresh cycle selection circuit. The programmable refresh circuit can be electrically programmed to generate one of a plurality of refresh control signals. A first one of the counters generates a first oscillating output signal having a first predetermined period and each successive counter generates a respective oscillating output signal having a respective period twice that of a respective preceding counter. The refresh cycle selection circuit selects a self refresh cycle from one of the oscillating output signals in response to the refresh control signal generated by the at least one programmable refresh circuit. Related methods are also disclosed.

20 Claims, 13 Drawing Sheets

PROGRAMMABLE REFRESH CIRCUITS AND METHODS FOR INTEGRATED CIRCUIT MEMORY DEVICES

FIELD OF THE INVENTION

The present invention relates to the field of integrated circuits and more particularly to integrated circuit memory devices.

BACKGROUND OF THE INVENTION

As the number of miniature and portable electronic systems increase, the demand for low power memory devices also increases. In particular, the power consumed by a dynamic random access memory is determined in part by the self refresh current, and the power consumption of the memory device can thus be decreased by decreasing the self refresh current. Because power consumption P is equal to the voltage V multiplied by the current I, the power consumption of the memory device can be reduced by reducing both the voltage and the current. The current consumed during a self refresh of a dynamic random access memory can be reduced by extending a period of the refresh cycle while still performing the refresh without generating data errors.

Figure 1:
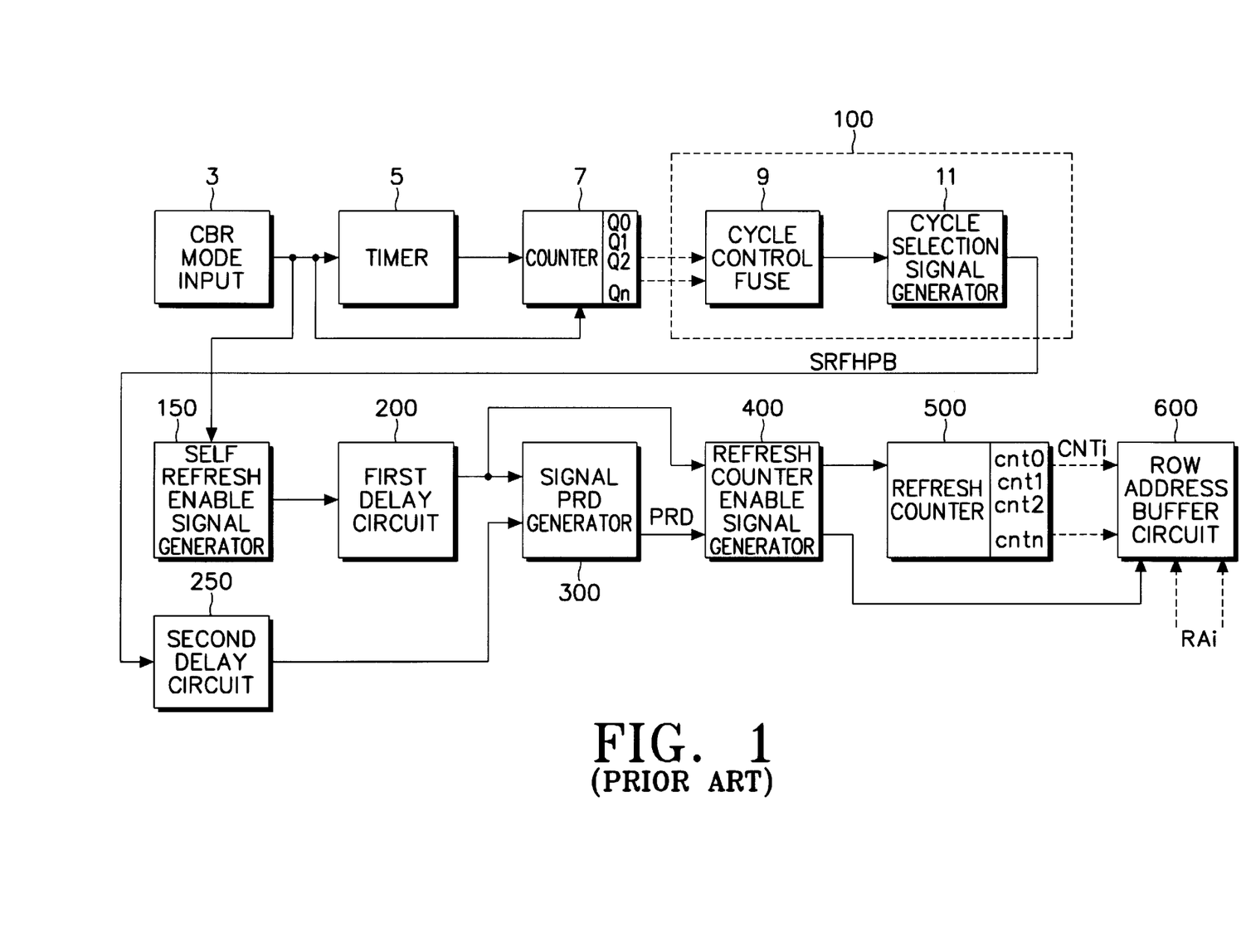
FIG. 1 is a block diagram illustrating a refresh circuit according to the prior art.

A self refresh for a dynamic random access memory can thus have different periods. A block diagram of a circuit for performing a refresh according to the prior art is shown in FIG. 1. The self refresh circuit includes a CAS before RAS mode input 3, a timer 5, a counter 7, a period regulating circuit 100, a first delay circuit 200, a second delay circuit 250, a self refresh enable single generator 150, a signal PRD generating circuit 300, a refresh counter enable signal generating circuit 400, a refresh counter 500, and a row address buffer circuit 600.

The timer 5 is connected to the CAS before RAS mode input 3 and regulates a time period. The counter 7 is connected to the timer 5 and the CAS before RAS mode input 3, and the counter 7 counts output signals. The period regulating circuit 100 includes a period regulating fuse 9 and a cycle selection signal generating circuit 11 for regulating and selecting a period in response to the output of the counter 7. The second delay circuit 250 is connected to the period regulating circuit 100 and delays a signal. The self refresh enable signal generator 150 is connected to the CAS before RAS mode input 3 and generates a self refresh enable signal.

The first delay circuit 200 is connected to the self refresh enable signal generating circuit 150 and a delays a self refresh enable signal for a predetermined time. The signal PRD generating circuit 300 is connected to the first delay circuit 200 and generates a signal PRD in response to the output signals from the first and second delay circuits. The refresh counter enable signal generating circuit 400 is connected to the first delay circuit 200 and the signal PRD generating circuit 300, and this circuit generates a refresh counter enable signal in response to output signals from the signal PRD generating circuit and the first delay circuit. The refresh counter 500 is connected to the refresh counter enable signal generating 400 and controls and counts a refresh in response to the output signal thereof. The row address buffer circuit 600 buffers the row address in response to the output signal of the refresh counter 500 and the row address RAi.

Figure 2:
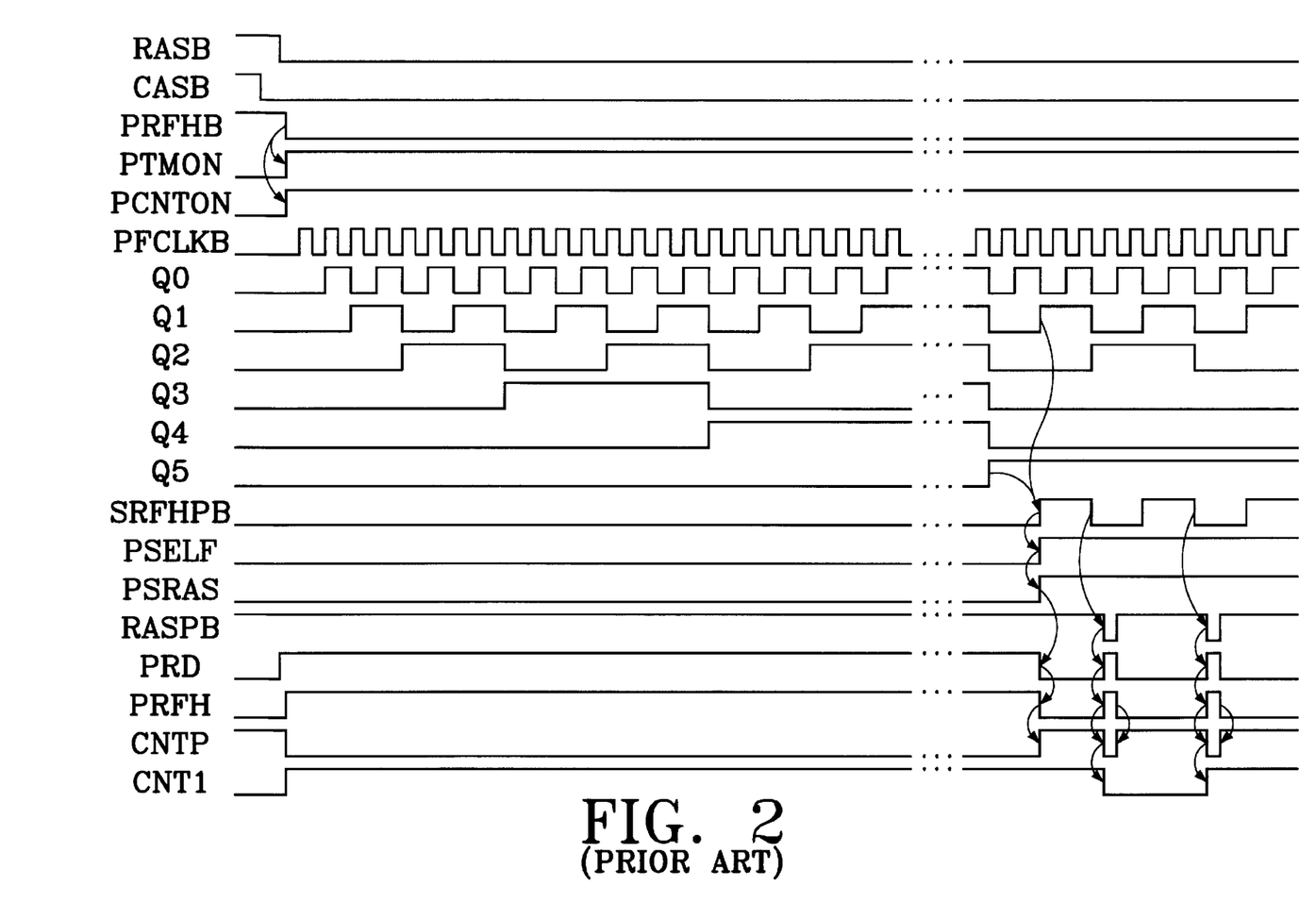
FIG. 2 is a timing diagram illustrating operation of the refresh circuit of FIG. 1.

FIG. 2 is a timing diagram illustrating a self refresh operation according to the circuit of FIG. 1. As shown, operation of the circuit of FIG. 1 is illustrated using counter output Q1 with a period of 32 $\mu$s.

If a signal is received by the CAS before RAS mode (CBR mode) input 3, a master clock signal PRFHB is enabled, and this master clock signal operates the timer 5. The master clock performs an oscillation operation by enabling the oscillation control signal POSC having a predetermined period. The oscillation control signal POSC, which has a period of 8 $\mu$s, is provided to the counter 7. The outputs Q0, Q1, Q2, . . . Qn of the counter 7 are generated in response to the oscillation control signal. With an oscillation control signal having a period of 8 $\mu$s, the counter outputs Q0-n may have respective oscillation periods of $2^{n+4}$ $\mu$s, and these output circuits may oscillate as shown in FIG. 2. If a dynamic random access memory has 16 Mf of capacitance, a refresh of 2K cycles/64 ms may be performed. Accordingly, the counter output having an oscillation period of 32 $\mu$s may be required. If a self refresh period of 128 $\mu$s can be used instead of a self refresh period of 64 $\mu$s, the current consumption of the refresh can be reduced by approximately one-half.

Figure 3:
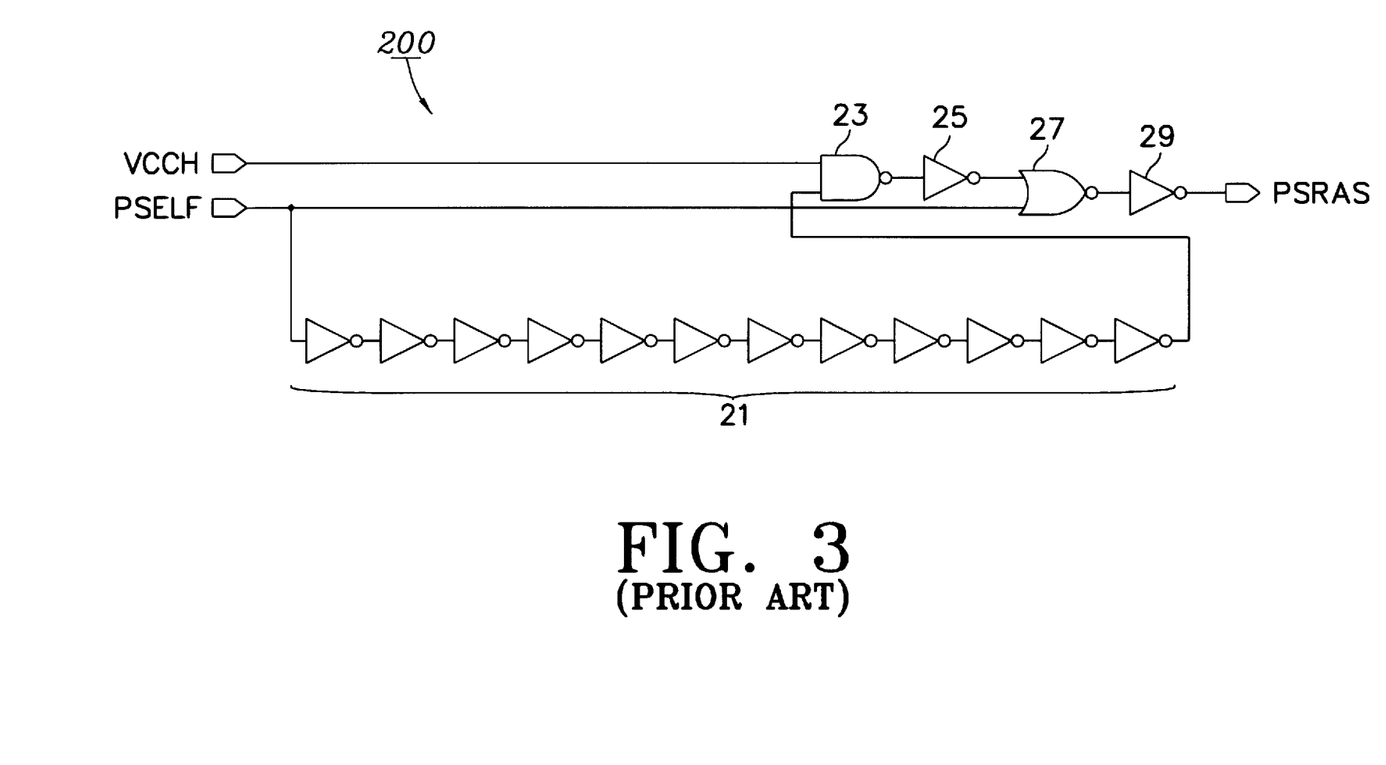
FIG. 3 is a circuit diagram illustrating a delay circuit according to FIG. 1.

FIG. 3 is a circuit diagram-illustrating a delay circuit 200 for the self refresh circuit of FIG. 1. The delay circuit 200 includes inputs for the predetermined inner power voltage VCCH and the self refresh enable signal PSELF. The circuit also includes the inverter chain 21, the NAND gate 23, the NOR gate 27, and the inverters 25 and 29. The NAND gate 23 generates an inverse logical product of the inner power voltage VCCH and the output of the inverter chain 21 which provides a delay for the refresh enable signal PSELF. The inverter 25 inverts the output of the NAND gate 23, and the NOR gate 27 performs an inverse logical sum of the output of the inverter 25 and the enable signal PSELF. The inverter 29 inverts the output of the NOR gate 27 to generate the signal PSRAS.

Figure 4:
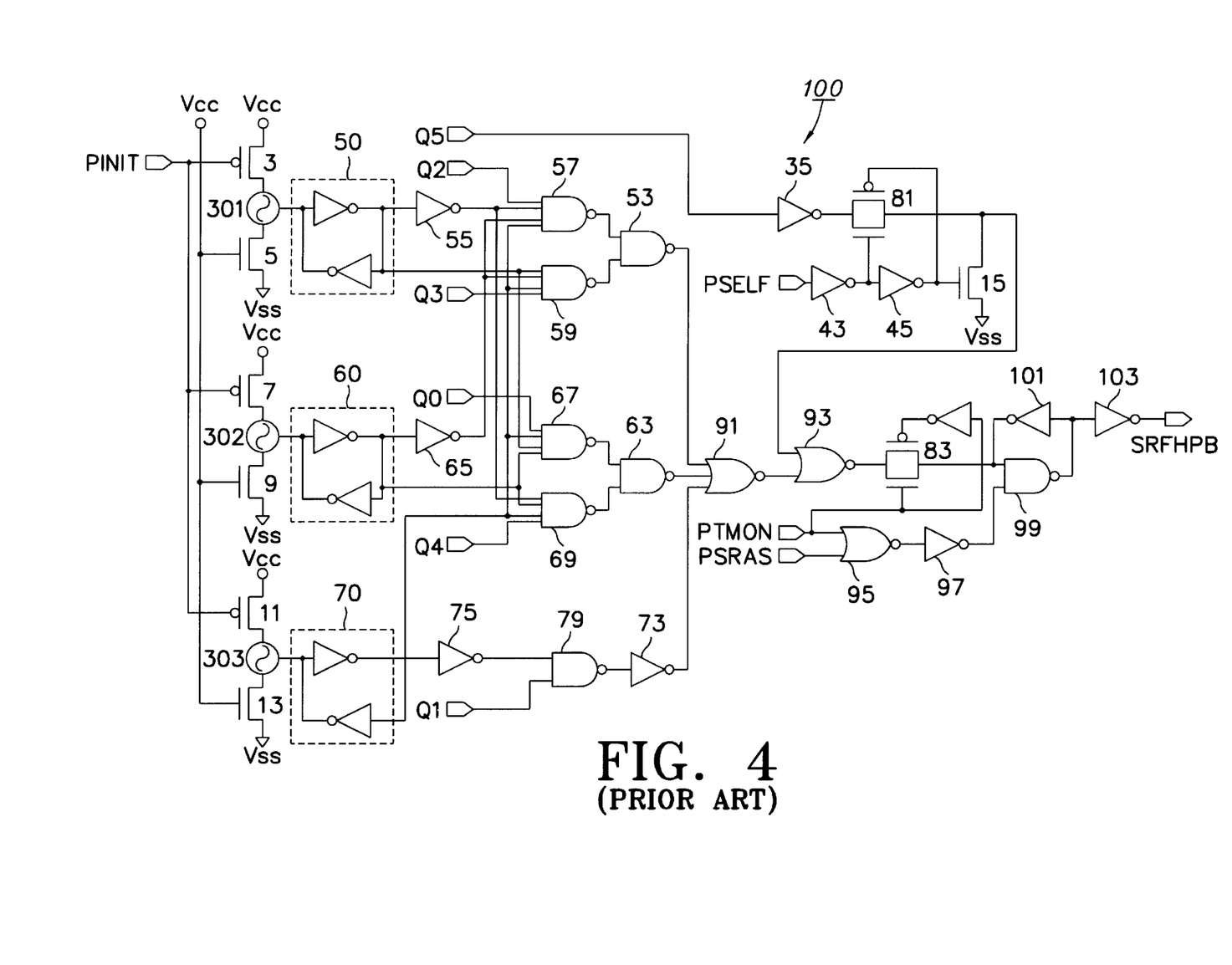
FIG. 4 is a circuit diagram illustrating a cycle selection circuit according to FIG. 1.

Accordingly, the refresh period can be controlled by providing a laser fuse which can be selectively cut to select a low power product. A circuit diagram of the cycle control fuse and cycle selection signal generator of FIG. 1 is illustrated in FIG. 4. As shown, fuses from the cycle selection circuit can be cut to determine the refresh period. In particular, the cycle selection signal SRFHPB is generated in response to the period of the counter output Q4 when the fuse 301 is cut because all logical low signals are applied to the input terminals of the NAND gates except for the NAND gate 69 which receives the counter output Q4.

If the fuse 302 is cut, the cycle selection signal SRFHPB is generated in response to the period of the counter output Q3. If the fuse 303 is cut, the cycle selection signal is controlled in response to the period of the counter output Q1. If fuses 301 and 302 are cut, the period of the counter output Q2 is used to generate the cycle selection signal. If none of the fuses are cut, the period of the counter output Q0 is used to control the cycle selection signal.

Figure 5:
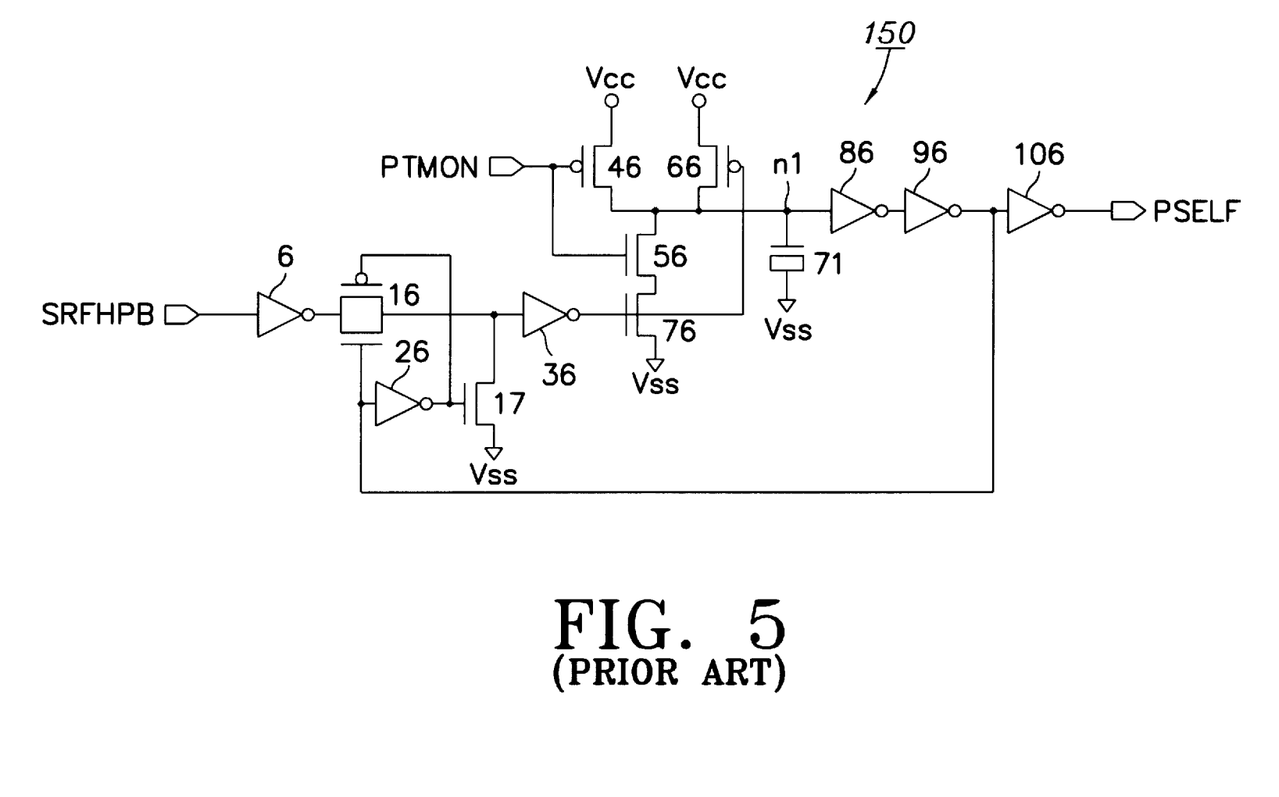
FIG. 5 is a circuit diagram illustrating a self refresh enable signal generator according to FIG. 1.

As previously discussed, the counter output Q0 has a period of 16 $\mu$s, the counter output Q1 has a period of 32 $\mu$s, the counter output Q2 has a period of 64 $\mu$s, and the counter output Q3 has a period of 128 $\mu$s. A counter output Q6 is applied to the refresh mode after the delay of a constant time of 256 $\mu$s even though the CBR mode has been entered, thus setting a logic low for an initial 256 $\mu$s, because the signal SRFHPB follows the period of the counter output Q0 when the self refresh enable signal PSELF is enabled. In FIG. 5, the signal PSELF is enabled when the signal SRFHPB is enabled to a logic high. The signal SRFHPB follows the period of the counter output Q0 when the counter output Q5 is enabled to a logic high as shown in FIG. 4.

FIG. 5 is a circuit diagram illustrating the self refresh enable signal generator 150 of FIG. 1. The signal generator includes an inverter 6, a transferring gate 16, an inverter 26, an NMOS transistor 17, an inverter 36, a PMOS transistor 46, an NMOS transistor 56, an NMOS transistor 76, a PMOS transistor 66, a capacitor 71, and inverters 86, 96, and 106. The inverter 6 inverts the cycle selection signal SRFHPB, and the transferring gate 16 is connected to the output terminal of the inverter 6 and switches a predetermined transferring signal. The inverter 26 is connected to the terminal of the NMOS transistor 17 and the transferring gate 16. The NMOS transistor 17 includes a gate connected to the output of the inverter 26, a drain connected to the output of the transferring gate 16, and a source connected to the ground voltage Vss.

The inverter 36 inverts the output of the transfer gate 16 and applies the inverted signal to the gate of NMOS transistor 76. A PMOS transistor 46 includes a gate connected to the input signal PTMON, a source connected to the power voltage Vcc, and a drain connected to node n1. The NMOS transistor 56 includes a drain connected to the drain of the PMOS transistor 46 and the NMOS transistor 56 receives the signal PTMON at its gate. The NMOS transistor 76 includes a gate connected to the output of the inverter 36, a drain connected to the source of NMOS transistor 56, and a source connected to the ground voltage Vss.

The PMOS transistor 66 includes a gate connected to the output of the inverter 36, a source connected to the power voltage Vcc, and a drain connected to the drain of PMOS transistor 46. The capacitor 71 is connected between the node n1 and the ground voltage Vss. The node n1 is also connected to the drain of the PMOS transistor 66 and the input of inverter 86. The inverters 86 and 96 delay an output signal from the node n1 for a predetermined period of time, and the inverter 106 generates the self refresh enable signal PSELF in response to the output of PMOS transistor 96.

The circuit described above can provide a counter output having a desired period by selectively laser cutting a fuse from the cycle selection signal generator. Once the desired fuses have been cut, however, the period of the refresh cycle cannot be changed again. The counter output used to determine the refresh cycle period for each combination of cut fuses is illustrated below in Table 1.

TABLE 1

| fuse | whether the fuse is cut | | | | | | | |
|---|---|---|---|---|---|---|---|---|
| fuse 301 | X | O | X | X | O | O | X | O |
| fuse 302 | X | X | O | X | X | O | O | O |
| fuse 303 | X | X | X | O | O | X | O | O |
| selected period | Q0 | Q4 | Q3 | Q1 | Q2 | Q1 | Q1 | Q1 |

O: cut
X: not cut

As shown in Table 1, according to the flow of counter outputs Q0→Q4→Q2→Q1, the products set to a defective counter output Q0 may have the desired counter output period by cutting the fuse 301. If the fuse 303 is cut, memory devices having the period of the counter output Q1 may be provided by further cutting counter output Q2. A problem may result, however, in that the products having the period of counter output Q3 cannot be embodied and the products cut once reduced to the period of a defective counter output Q0. Furthermore, the refresh period cannot be changed once the memory device is packaged because the fuses are cut by laser.

SUMMARY OF THE INVENTION

It is therefore an object of the present invention to provide improved self refresh circuits and methods for integrated circuit memory devices.

It is another object of the present invention to provide a self refresh circuit which can be programmed after packaging.

It is still another object of the present invention to provide a self refresh circuit which can be reprogrammed after initial programming.

It is yet another object of the present invention to provide a self refresh circuit which can be programmed to provide extended or shortened refresh cycles.

These and other objects according to the present invention are provided by self refresh circuits for integrated circuit memory devices including a programmable refresh circuit which can be electrically programmed to generate one of a plurality of refresh control signals. The self refresh circuit also includes a plurality of counters and a refresh cycle selection circuit. In particular, a first one of the counters generates a first oscillating output signal having a first predetermined period, and each successive counter generates a respective oscillating output signal having a respective period twice that of a respective preceding counter. The refresh cycle selection circuit selects a self refresh cycle from one of the oscillating output signals in response to the refresh control signal generated by the programmable refresh circuit. The electrically programmable refresh circuit can thus be programmed after packaging the memory device.

More particularly, the programmable refresh circuit can be electrically programmed to generate a first one of the refresh control signals and then electrically reprogrammed to generate a second one of the refresh control signals. This programmable refresh circuit may include at least one electrical fuse which can be cut by providing a predetermined electrical current therethrough, and at least one electrical fuse circuit which provides the predetermined electrical current to cut the at least one electrical fuse in accordance with the desired refresh cycle. In addition, the at least one electrical fuse can include a plurality of electrical fuses and the at least one electrical fuse circuit can include a respective plurality of electrical fuses wherein the refresh control signal is generated according to a number of electrical fuses which have been cut.

The self refresh circuit can further include an electrical fuse master clock generator having a master clock fuse wherein the at least one electrical fuse can be reset to an uncut condition by cutting the master clock fuse. Like the at least one electrical fuse, the master clock fuse can be cut by applying a predetermined current thereto.

According to an alternate aspect of the present invention, a method is provided for generating a self refresh cycle for an integrated circuit memory device. This method includes electrically programming the integrated circuit memory device to generate one of a plurality of refresh control signals, and generating a plurality of oscillating output signals wherein a first one of the oscillating output signals has a first predetermined period and wherein each successive oscillating output signal has a respective period twice that for a respective preceding oscillating output signal. A self refresh cycle is selected from one of the oscillating output signals in response to the generated refresh control signal.

According to the circuits and methods of the present invention, a refresh circuit for an integrated circuit memory device can be programmed and then reprogrammed after packaging. A desired refresh cycle can thus be chosen to reduce power consumption while maintaining an adequate refresh period.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 6:
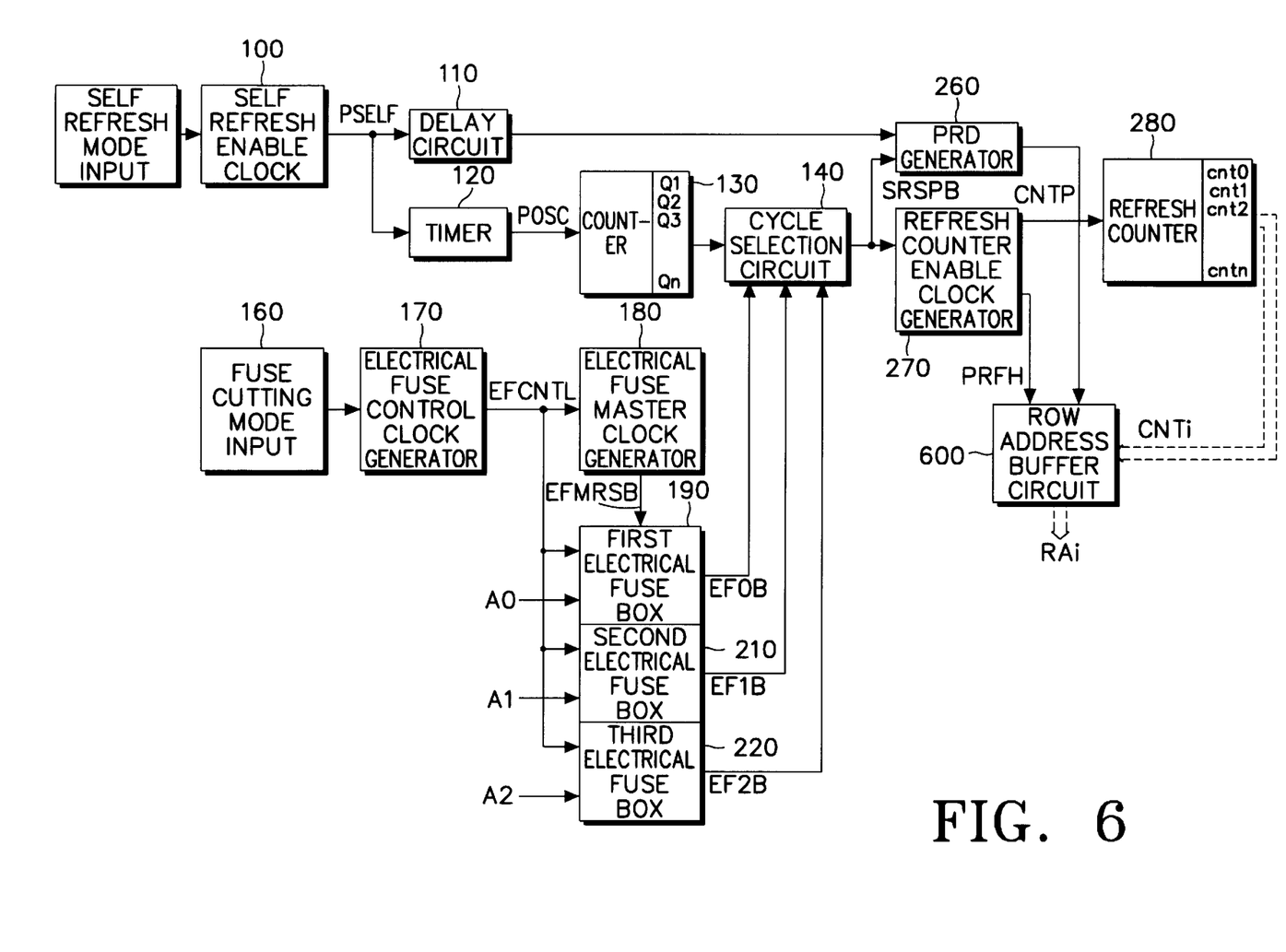
FIG. 6 is a block diagram illustrating a self refresh circuit according to the present invention.

FIG. 6 is a block diagram illustrating a self refresh circuit according to the present invention. This circuit generates a self refresh enable signal in response to the input of a self refresh mode. The circuit of the present invention includes a delay circuit 110, a signal PRD generator 260, a timer 120, a counter 130, an electrical fuse control clock generator 170, an electrical fuse master clock generator 180, electrical fuse boxes 190, 210, and 220, a cycle selection circuit 140, a refresh counter enable clock generator 270, a refresh counter 280, and a row address buffer circuit 600.

The delay circuit 110 delays the refresh enable signal PSELF for a predetermined time, and the signal PRD generator 260 generates a signal PRD while connected to the output terminal of the delay circuit 110. The timer 120 generates an oscillation control signal POSC in response to the refresh enable signal PSELF. The counter 130 generates counter outputs Q1-n in response to the oscillation control signal PSELF generated by the timer 120. The electrical fuse control clock generator 170 generates an electrical fuse control clock EFCNTL after receiving a fuse cutting mode input 160. The electrical fuse master clock generator 180 generates an electrical fuse master clock EFMRSB while connected to the output terminal of the electrical fuse control clock generator 170. The first, second, and third electrical fuse boxes 190, 210, and 220 generate respective electrical fuse signals EF0B, EF1B, and EF2B in response to the status of the fuses therein, the electrical fuse control clock EFCNTL, and the addresses A0, A1, and A2. Each of the electrical fuse boxes is connected to the output terminal of the electrical fuse control clock generator 170.

The cycle selection circuit 140 controls the cycle of the counter output by generating the cycle selection signal SRSPB in response to the electrical fuse signals and the counter outputs. The cycle selection signal SRSPB is provided to the signal PRD generator 260 and the refresh counter enable clock generator 270. The signal PRD generator generates the PRD signal, and the refresh counter enable clock generator 270 generates the refresh counter enable clock CNTP. The refresh counter 280 receives the refresh counter enable clock CNTP and counts the refresh. The row address buffer circuit 600 generates a row address RAi by buffering a predetermined row address in response to an output signal PRFH generated by the refresh counter enable clock generator 270. The row address buffer circuit 600 operates under control of the PRD signal and the output signals cnt0-n of the refresh counter 280.

Figure 7:
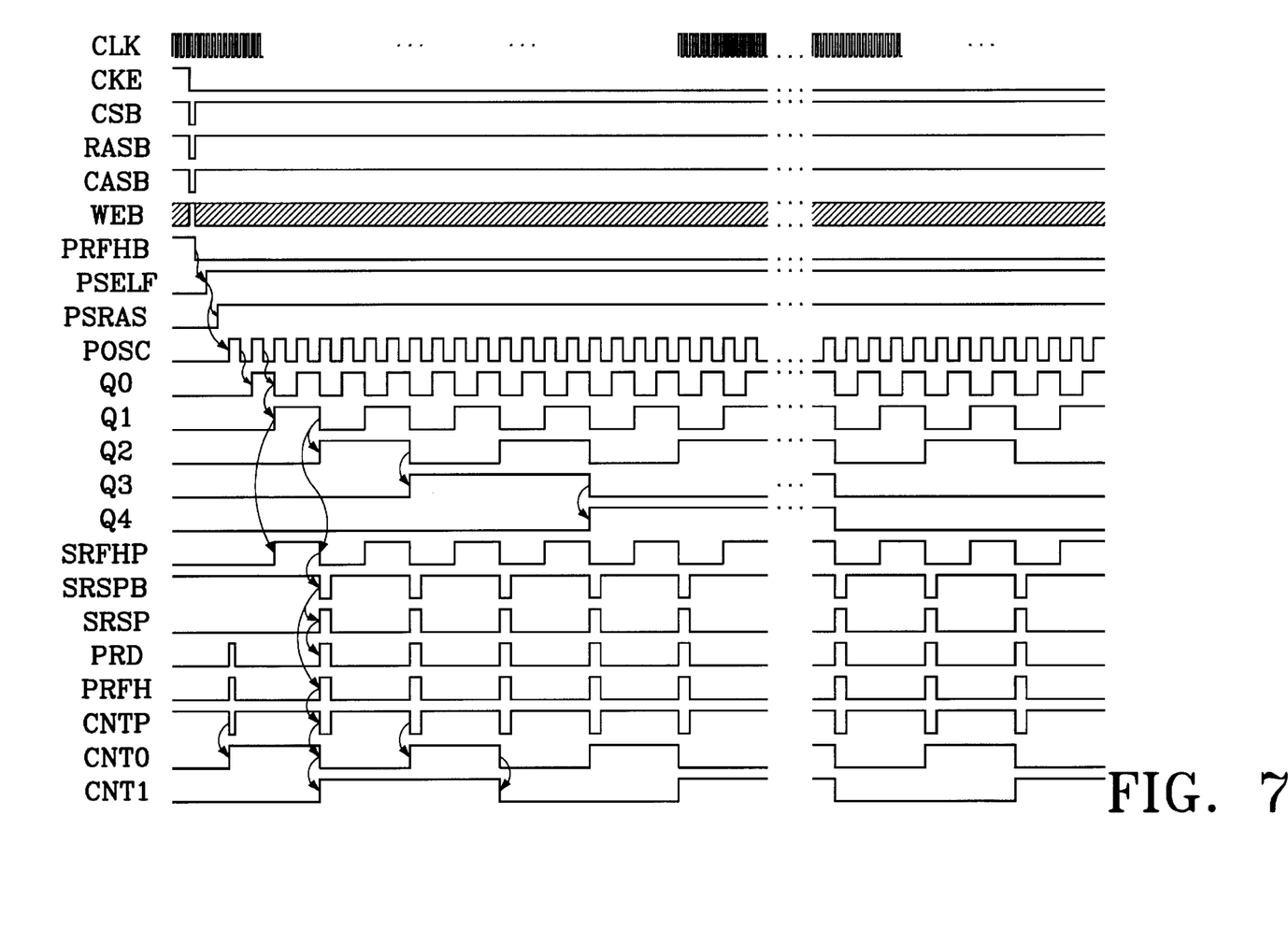
FIG. 7 is a timing diagram illustrating operation of the self refresh circuit of FIG. 6.

FIG. 7 is a timing diagram illustrating the operation of the self refresh circuit of FIG. 6. The self refresh circuit of the present invention is designed to control the refresh cycle after packaging by selecting a counter output which determines the period of the self refresh using the programmable electrical fuse boxes. If a signal is applied during a self refresh mode, a self refresh enable signal PSELF can be enabled. The self refresh enable signal PSELF of FIG. 6 is provided to the timer 120 which generates the oscillation control signal POSC which oscillates at a constant period.

Figure 8:
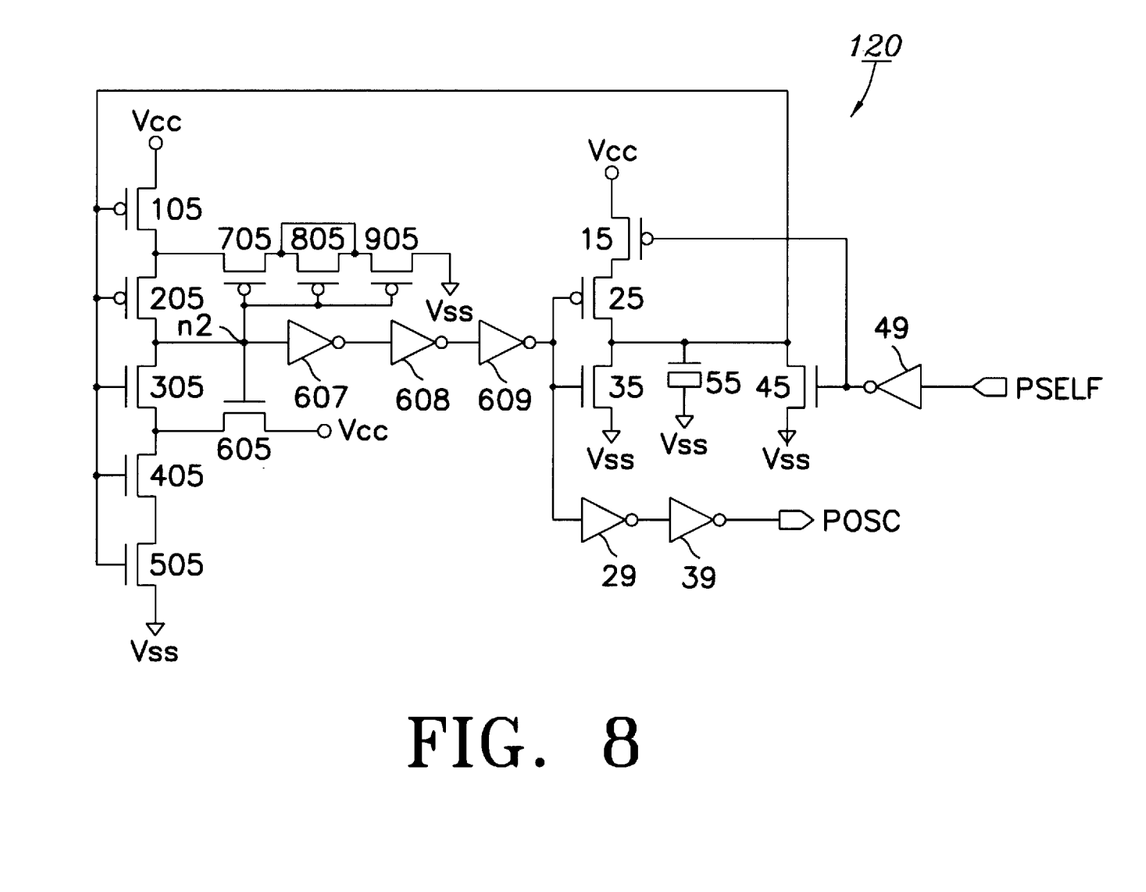
FIG. 8 is a circuit diagram of a timer according to FIG. 6.

FIG. 8 is a circuit diagram of the timer 120 of FIG. 6. The timer 120 includes PMOS transistors 105 and 205 and NMOS transistors 305, 405, and 505. The transistors 105, 205, 305, 405, and 505 are arranged in series between the power voltage Vcc and the ground voltage Vss. The PMOS transistor 705 includes a source connected to a node between the PMOS transistors 105 and 205, and the NMOS transistor 605 includes a source connected between the NMOS transistors 305 and 405. The drain of the NMOS transistor 605 is connected to the power voltage Vcc, and the gate of the NMOS transistor 605 is connected to the gates of the PMOS transistors 705, 805, and 905, as well as the input terminal of inverter 607. This common node n2 is also connected between transistors 205 and 305. The inverter chain including inverters 607, 608, and 609 delays the signal generated at the node n2.

The output of inverter 609 is connected to the gates of PMOS transistor 25 and NMOS transistor 35 as well as to the input of inverter 29. The output of inverter 29 is provided to the inverter 39 which generates the oscillation control signal POSC by delaying the signal for a predetermined time from generation thereby from inverter 609. The signal PSELF is inverted by inverter 49 and this inverted signal is provided to the gate of PMOS transistor 15. The drain of PMOS transistor 15 is connected to the source of the PMOS transistor 25, and the source of PMOS transistor 15 is connected to the power voltage Vcc. The source of the NMOS transistor 45 is connected to the ground voltage Vss, the drain of NMOS transistor 45 is connected to PMOS transistor 25 and NMOS transistor 35, and the drain of NMOS transistor 45 is connected to the gates of transistors 105, 205, 305, 405, and 505. The gate of the NMOS transistor 45 is connected to the output of the inverter 49.

Figure 9:
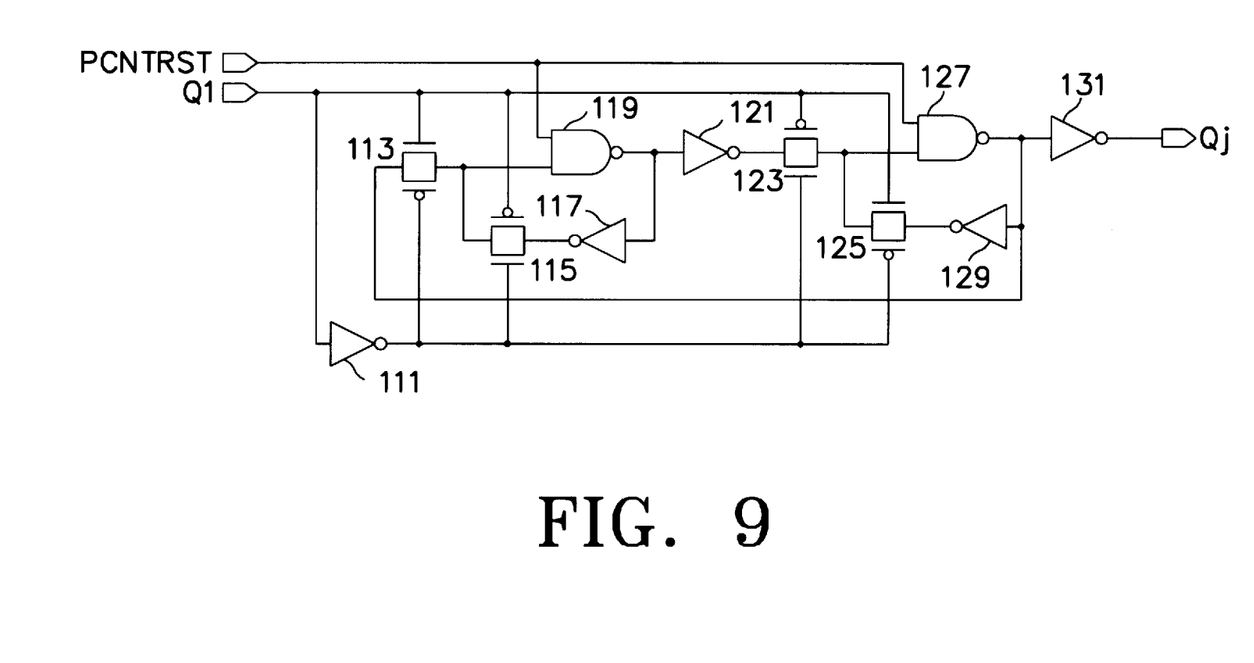
FIG. 9 is a circuit diagram illustrating a counter according to FIG. 6.

FIG. 9 is a circuit diagram illustrating a counter according to the present invention. The counter includes an inverter 111, transfer gates 113, 115, 123, and 125, a NAND gate 119, an inverter 117, an inverter 121, a transfer gate 123, a NAND gate 127, and an inverter 131. The inverter 111 generates a signal which controls the transfer gates 113, 115, 123, and 125 by inverting the counter output Q1. The transfer gates 113, 115, 123, and 125 thus control respective transfer signals responsive to the counter output Q1. The NAND gate 119 performs an inverse logical product of the signal PCNTRST and the signal generated by the transfer gates 113 and 115. The input terminal of inverter 117 is connected to the output terminal of the NAND gate 119 and the output terminal is connected to the input terminal of transfer gate 115.

The input of inverter 121 is connected to the output terminal of the NAND gate 119. The transfer gate 123 has inputs connected to the counter output Q1 and a compensating counter output and the input terminal is connected to the output of the inverter 121. The NAND gate 127 performs an inverse logical product of the output of the transfer gates 123 and 125 and the signal PCNTRST. The inverter 131 generates the counter output Qj by inverting the output of NAND gate 127.

Figure 10:
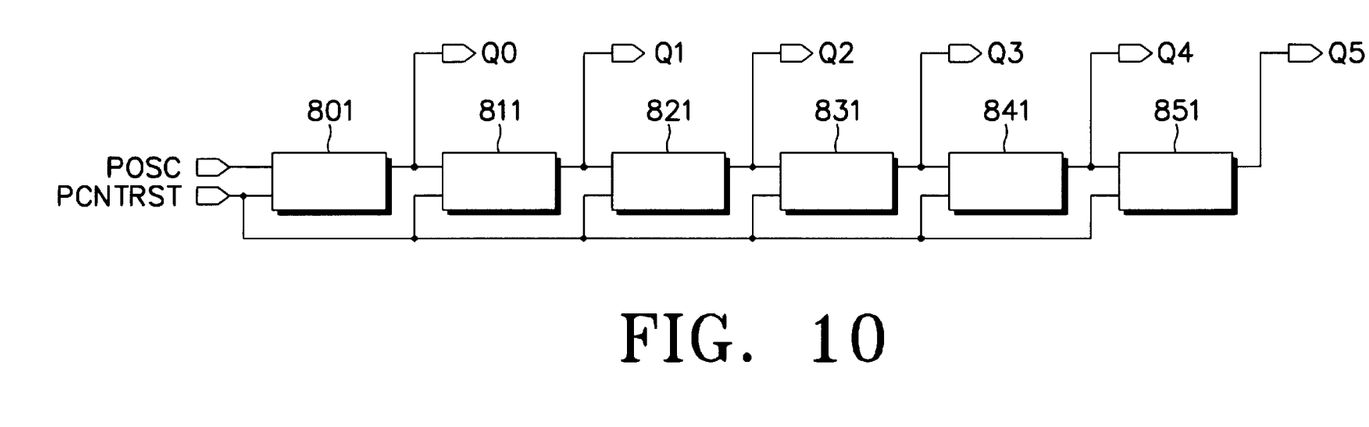
FIG. 10 is a circuit diagram illustrating a serial connection of counters according to FIG. 6.

FIG. 10 is a block diagram illustrating the serial connection of counters according to the present invention. As shown, the counters 801, 811, 821, 831, 841, and 851 are combined in series. The oscillation control signal POSC and the signal PCNTRST are provided as inputs to the first counter 801, and the output of each counter is provided to the next successive counter. Accordingly, the counter 801, 811, 821, 831, 841, and 851 respectively generate the counter outputs Q1, Q2, Q3, Q4, and Q5.

The self refresh circuit of the present invention will be discussed hereinafter having an oscillation period of 8 $\mu$s. The oscillation control signal POSC thus has a constant period of 8 $\mu$s and is received at the counter. Each successive counter thus generates a counter output having a period two times that of the preceding counter. As shown in FIG. 10, the first counter output is received at the input of the second counter, and the counter output Q0 has a period two times that of the signal POSC. Accordingly, the counter outputs Q0, Q1, Q2, Q3, Q4, and Q5 have respective periods of 16 $\mu$s, 32 $\mu$s, 64 $\mu$s, 128 $\mu$s, 256 $\mu$s, and 512 $\mu$s, respectively.

Figure 15:
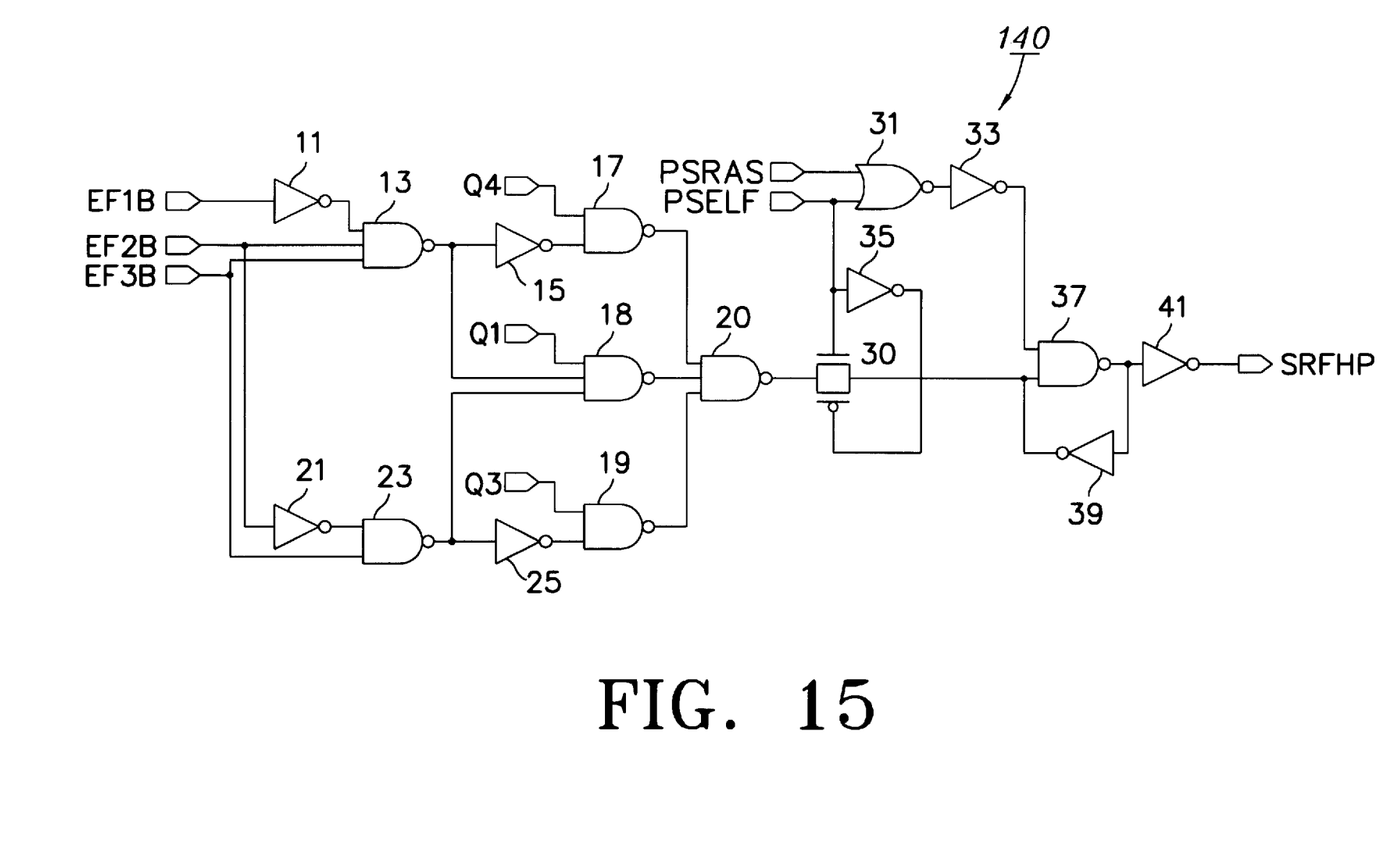
FIG. 15 is a circuit diagram of a self refresh cycle selection circuit according to FIG. 6.

FIG. 15 is a circuit diagram illustrating a self refresh cycle selection circuit according to the present invention. This self refresh cycle selection circuit 140 selects one of the clock counter outputs Q1, Q3, and Q4 according to the state of the electrical fuse box output signals EF1B, EF2B, and EF3B to generate the output signal SRFHP. If the electrical fuse box output signals EF1B, EF2B, and EF3B are low, then the counter output Q1 is selected, and the output signal SRFHP oscillates at the same cycle as counter output Q1. Accordingly, the signal SRFHP oscillates with a period of 32 $\mu$s.

Figure 11:
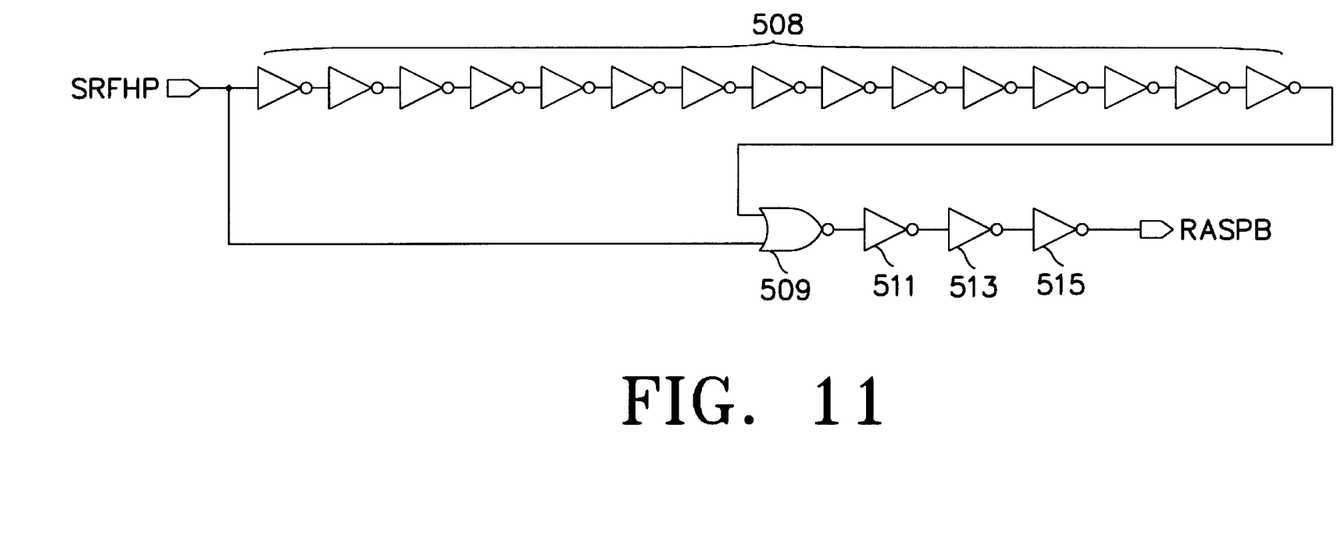
FIG. 11 is a circuit diagram illustrating a pulse generator for supplying a predetermined pulse with a cycle selection circuit according to FIG. 6.

FIG. 11 is a circuit diagram of a pulse generator which generates a predetermined pulse for the cycle selection circuit of the present invention. The pulse generator includes a NOR gate 509, inverters 511, 513, and 515, and an inverter chain 508. The NOR gate 509 combines the input signal SRFHP with a delayed and inverted version of the input signal SRFHP. The inverters 511, 513, and 515 invert and delay the output of NOR gate 509 to generate the signal RASPB. Accordingly, the signal SRFHP is used to generate the signal SRSPB after a predetermined delay, and the signal SRFHP is also used to generate the signal PRFH by turning on a transistor which transfers the output of refresh counter 280 to the row address buffer circuit 600 as well as the clock CNTP which operates refresh counter 280 of FIG. 6. The generation of these signals is illustrated in the timing diagram of FIG. 7.

The refresh circuit of the present invention can thus select the period of the refresh cycle after packaging the chip by selecting the counter output Qi of FIG. 10 by means of an electrical fuse. As shown in FIG. 6, when a mode register is selected and used in a synchronize dynamic random access memory to be applied to a self refresh cycle selection mode, the self refresh cycle selection mode is allocated by selecting a mode register set not used.

Figure 12:
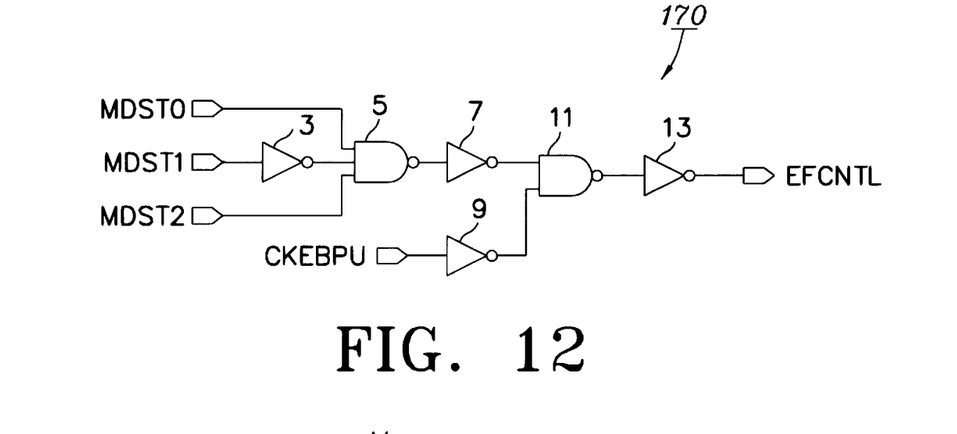
FIG. 12 is a circuit diagram illustrating an electrical fuse control clock generator according to FIG. 6.
Figure 13:
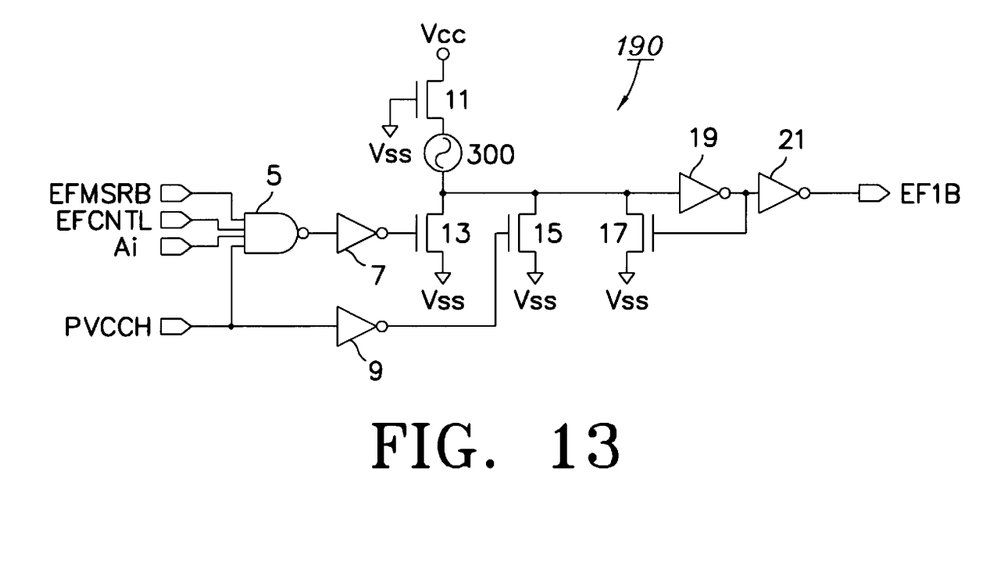
FIG. 13 is a circuit diagram of an electrical fuse box according to FIG. 6.

FIG. 12 is a circuit diagram illustrating an electrical fuse control clock generator 170 according to the present invention. If a signal is received at a self refresh cycle selection mode, a fuse of a fuse box is cut because the clock EFCNTL is enabled. FIG. 13 is a circuit diagram of an electrical fuse box 190 according to the present invention. For example, a clock EFCNTL is enabled and a high voltage is applied to an address Ai of an address pin of each fuse box, the electrical fuse 300 will be cut.

Figure 14:
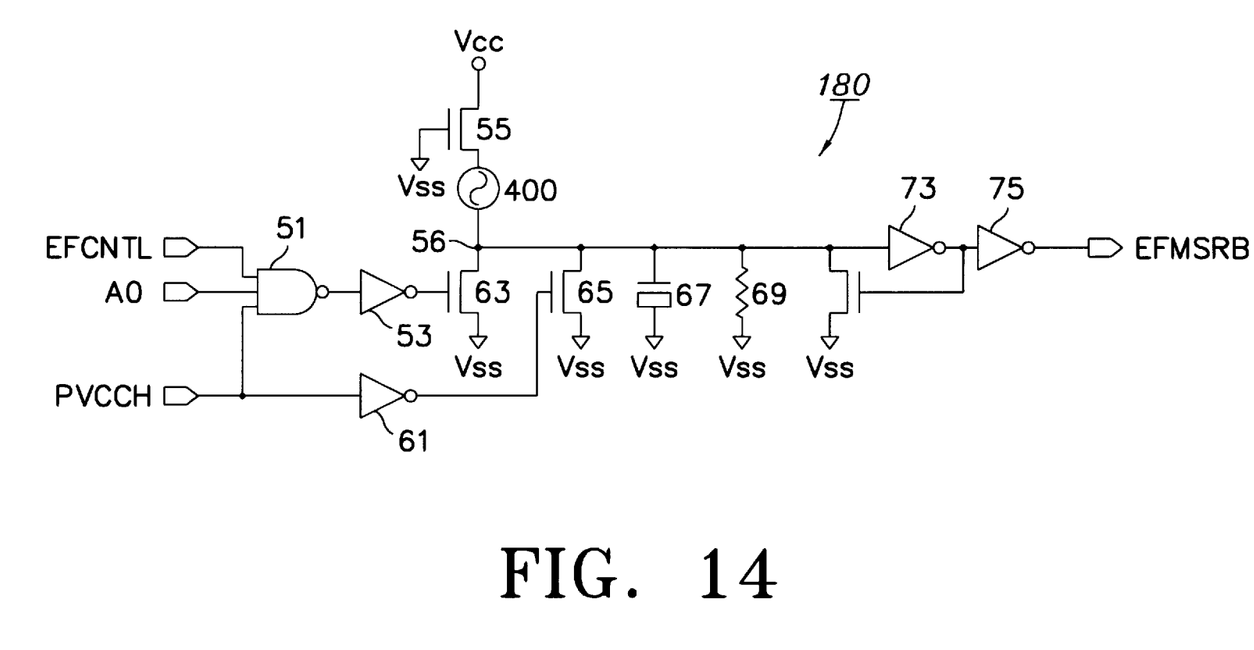
FIG. 14 is a circuit diagram of an electrical fuse master clock generator according to FIG. 6.

FIG. 14 is a circuit diagram of the electrical fuse master clock generator 180 according to the present invention. The master clock generator includes a NAND gate 51, inverters 53 and 61, NMOS transistors 63, 55, 65, and 71, a capacitor 67, a resistor 69, and inverters 73 and 75. The input of inverter 53 is connected to the output of the NAND gate 51, and the input of inverter 61 is connected to the signal PVCCH. The gate of NMOS transistor 65 is connected to the output of inverter 61. The NMOS transistor 63 includes a gate connected to the output of the inverter 53, and NMOS transistor 55 includes a gate connected to the ground voltage Vss. The NMOS transistor 55 also includes a source connected to the power voltage Vcc, and a drain connected to the source of NMOS transistor 63 through the fuse 400. The capacitor 67 is connected between the node 56 and the ground voltage Vss. The resistor 69 is also connected between the node 56 and the ground voltage. The inverter 73 inverts the signal at node 56 and provides this inverted signal to inverter 75 as well as the gate of NMOS transistor 71. The inverter 75 generates the output signal EFMSRB.

Accordingly, the signal EFMSRB is enabled with the clock EFCNTL so that the electrical fuse 300 can be selected at a desired cycle. If the address Ai is applied at a high level, the fuse 400 of FIG. 14 will be cut after the fuse 300 of the fuse box of FIG. 13 is cut to prevent the fuse 400 from being cut. One of the outputs Q1, Q3, or Q4 will thus be selected in the combination of the output signals EFiB since the output EFiB of a fuse box whose fuse is cut is low. The output EFiB of a fuse box whose fuse is not cut is high as shown in FIG. 15. The three fuse boxes shown in FIG. 11 will be described hereinafter.

If the output signals of the three fuse boxes are EF1B, EF2B, EF3B, and if only one fuse is not cut, all the signals EF1B, EF2B, and EF3B will be high and a counter output Q1 will be selected. The counter output Q1 has a self refresh period of 64 ms when the period of 32 $\mu$s operates at 2K. If only a fuse of the first electrical fuse box is cut, the signal EF1B is low, and the signals EF2B and EF3B are high. Accordingly, the counter output Q4 is selected. Because the counter output Q4 has a period of 256 $\mu$s, it will generate a refresh period of 512 ms operating at 2K.

If the second and third electrical fuse boxes are cut, the signals EF1B and EF2B are low, and the signal EF3B is high, the counter output Q1 will be selected and reduced in the period of defective value. As described above, if the number of fuses cut continues to increase, a period test of a self refresh is possible in the order of counter outputs Q1 (defect)→Q4→Q3→Q1.

According to the present invention, a self refresh is ensured and the power dissipation is reduced because the period test is possible in order to provide a long refresh period. Accordingly, the refresh period can be increased or reduced to a desired period after packaging the memory device by electrically cutting fuses. Furthermore, a low power memory device can be provided even when a self refresh is initially defective. Furthermore, the use of an electrical fuse as opposed to a laser fuse allows programming of the refresh cycle even after packaging the memory device. Accordingly, the refresh cycle can be later programmed by a purchaser of the memory device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A self refresh circuit for an integrated circuit memory device, said self refresh circuit comprising:
    a programmable refresh circuit which can be electrically programmed to generate one of a plurality of refresh control signals;
    a plurality of counters wherein a first one of said counters generates a first oscillating output signal having a first predetermined period and wherein each successive counter generates a respective oscillating output signal having a respective period twice that of a respective preceding counter; and
    a refresh cycle selection circuit which selects a self refresh cycle from one of said oscillating output signals in response to said refresh control signal generated by said at least one programmable refresh circuit.

2. A self refresh circuit according to claim 1 wherein said programmable refresh circuit can be electrically programmed to generate a first one of said refresh control signals and then electrically reprogrammed to generate a second one of said refresh control signals.

3. A self refresh circuit according to claim 1 wherein said programmable refresh circuit comprises:
    at least one electrical fuse which can be cut by providing a predetermined electrical current therethrough; and
    at least one electrical fuse circuit which provides said predetermined electrical current to cut said at least one electrical fuse in accordance with a desired refresh cycle.

4. A self refresh circuit according to claim 3 wherein said at least one electrical fuse comprises a plurality of electrical fuses, wherein said at least one electrical fuse circuit comprises a respective plurality of electrical fuses, and wherein said self refresh control signal is generated according to a number of electrical fuses which have been cut.

5. A self refresh circuit for an integrated circuit memory device, said self refresh circuit comprising:
    a programmable refresh circuit which can be electrically programmed to generate one of a plurality of refresh control signals, wherein said programmable refresh circuit comprises,
    at least one electrical fuse which can be cut by providing a predetermined electrical current therethrough, and
    at least one electrical fuse circuit which provides said predetermined electrical current to cut said at least one electrical fuse in accordance with a desired refresh cycle;
    a plurality of counters wherein a first one of said counters generates a first oscillating output signal having a first predetermined period and wherein each successive counter generates a respective oscillating output signal having a respective period twice that of a respective preceding counter;
    a refresh cycle selection circuit which selects a self refresh cycle from one of said oscillating output signals in response to said refresh control signal generated by said at least one programmable refresh circuit; and
    an electrical fuse master clock generator having a master clock fuse wherein said at least one electrical fuse can be reset to an uncut condition by cutting said master clock fuse.

6. A self refresh circuit according to claim 5 wherein said master clock fuse can be cut by applying a predetermined current thereto.

7. A method for generating a self refresh cycle signal for an integrated circuit memory device, said method comprising the steps of:
    electrically programming the integrated circuit memory device to generate one of a plurality of refresh control signals;
    generating a plurality of oscillating output signals wherein a first one of said oscillating output signals has a first predetermined period and wherein each successive oscillating output signal has a respective period twice that of a respective preceding oscillating output signal; and
    selecting a self refresh cycle from one of said oscillating output signals in response to said generated refresh control signal.

8. A method according to claim 7 wherein said step of electrically programming the integrated circuit memory device includes electrically programming the memory device to generate a first one of said refresh control signals and then electrically reprogramming the memory device to generate a second one of said refresh control signals.

9. A method according to claim 7 wherein said step of electrically programming the memory device includes cutting an electrical fuse of the memory device by providing a predetermined electrical current therethrough.

10. A self refresh circuit for an integrated circuit memory device, said self refresh circuit comprising:
    at least one electrical fuse which can be cut by providing a predetermined electrical current therethrough;
    at least one electrical fuse circuit which provides said predetermined electrical current to cut said at least one electrical fuse in accordance with a desired refresh cycle;
    a plurality of counters wherein a first one of said counters generates a first oscillating output signal having a first predetermined period and wherein each successive counter generates a respective oscillating output signal having a respective period twice that of a respective preceding counter; and
    a refresh cycle selection circuit which selects a self refresh cycle from one of said oscillating output signals in response to a state of said at least one electrical fuse.

11. A self refresh circuit according to claim 10 wherein said at least one electrical fuse comprises a plurality of electrical fuses, wherein said at least one electrical fuse circuit comprises a respective plurality of electrical fuses, and wherein said self refresh cycle is selected according to a number of electrical fuses which have been cut.

12. A self refresh circuit for an integrated circuit memory device, said self refresh circuit comprising:

at least one electrical fuse which can be cut by providing a predetermined electrical current therethrough;

at least one electrical fuse circuit which provide said predetermined electrical current to cut said at least one electrical fuse in accordance with a desired refresh cycle;

a plurality of counters wherein a first one of said counters generates a first oscillating output signal having a first predetermined period and wherein each successive counter generates a respective oscillating output signal having a respective period twice that of a respective preceding counter; and a refresh cycle selection circuit which selects a self refresh cycle from one of said oscillating output signals in response to a state of said at least one electrical fuse;

wherein said at least one electrical fuse circuit comprises:
an electrical fuse control clock generator which generates a signal which controls cutting of said at least one electrical fuse at an input node for cutting said at least one electrical fuse; and an electrical fuse master clock generator connected to said electrical fuse control clock generator, wherein said electrical fuse master clock generator generates a master clock signal.

13. A self refresh circuit for an integrated circuit memory device, said self refresh circuit comprising:

at least one electrical fuse which can be cut by providing a predetermined electrical current therethrough;

at least one electrical fuse circuit which provides said predetermined electrical current to cut said at least one electrical fuse in accordance with a desired refresh cycle;

a plurality of counters wherein a first one of said counters generates a first oscillating output signal having a first predetermined period and wherein each successive counter generates a respective oscillating output signal having a respective period twice that of a respective preceding counter;

a refresh cycle selection circuit which selects a self refresh cycle from one of said oscillating output signals in response to a state of said at least one electrical fuse; and an electrical fuse master clock generator having a master clock fuse wherein said at least one electrical fuse can be reset to an uncut condition by cutting said master clock fuse.

14. A self refresh circuit according to claim 13 wherein said master clock fuse can be cut by applying a predetermined current thereto.

15. A self refresh circuit for an integrated circuit memory device, said self refresh circuit comprising:

a programmable refresh circuit which can be electrically programmed to generate one of a plurality of refresh control signals;

means for generating a plurality of oscillating output signals wherein a first oscillating output signal has a first predetermined period and wherein each successive oscillating output signal has a respective period twice that of a respective preceding oscillating output signal; and a refresh cycle selection circuit which selects a self refresh cycle from one of said oscillating output signals in response to said refresh control signal generated by said at least one programmable refresh circuit.

16. A self refresh circuit according to claim 15 wherein said programmable refresh circuit can be electrically programmed to generate a first one of said refresh control signals and then electrically reprogrammed to generate a second one of said refresh control signals.

17. A self refresh circuit according to claim 15 wherein said programmable refresh circuit comprises:

at least one electrical fuse which can be selectively activated; and at least one fuse circuit which activates said at least one electrical fuse in accordance with a desired refresh cycle.

18. A self refresh circuit according to claim 17 wherein said at least one fuse comprises a plurality of fuses, wherein said at least one fuse circuit comprises a respective plurality of fuse circuits, and wherein said self refresh control signal is generated according to a number of fuses which have been activated.

19. A self refresh circuit for an integrated circuit memory device, said self refresh circuit comprising:

a programmable refresh circuit which can be electrically programmed to generate one of a plurality of refresh control signals, wherein said programmable refresh circuit comprises, at least one electrical fuse which can be selectively activated, and at least one fuse circuit which activates said at least one electrical fuse in accordance with a desired refresh cycle;

means for generating a plurality of oscillating output signals wherein a first oscillating output signal has a first predetermined period and wherein each successive oscillating output signal has a respective period twice that of a respective preceding oscillating output signal;

a refresh cycle selection circuit which selects a self refresh cycle from one of said oscillating output signals in response to said refresh control signal generated by said at least one programmable refresh circuit; and an electrical fuse master clock generator having a master clock fuse wherein said at least one fuse can be reset to an inactivated condition by activating said master clock fuse.

20. A self refresh circuit according to claim 19 wherein said master clock fuse can be activated by applying a predetermined current thereto.

* * * * *